(12) United States Patent
Roy et al.

(10) Patent No.: US 8,603,593 B1
(45) Date of Patent: Dec. 10, 2013

(54) METHOD FOR PROVIDING AN IMPROVED HARD BIAS STRUCTURE

(71) Applicant: Western Digital (Fremont), LLC, Fremont, CA (US)

(72) Inventors: Anup G. Roy, Fremont, CA (US); Mahendra Pakala, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/621,799

(22) Filed: Sep. 17, 2012

Related U.S. Application Data

(62) Division of application No. 12/140,211, filed on Jun. 16, 2008, now Pat. No. 8,270,126.

(51) Int. Cl.
*H05H 1/24* (2006.01)

(52) U.S. Cl.
USPC .......................................... 427/576; 427/569

(58) Field of Classification Search
USPC .................................................. 427/576, 569
See application file for complete search history.

(56) References Cited

U.S. PATENT DOCUMENTS

| | | | |
|---|---|---|---|
| 6,118,624 A | 9/2000 | Fukuzawa et al. | |
| 6,144,534 A | 11/2000 | Xue et al. | |
| 6,146,776 A | 11/2000 | Fukuzawa et al. | |
| 6,351,357 B1 | 2/2002 | Xue et al. | |
| 6,853,519 B2 * | 2/2005 | Parker et al. | 360/322 |
| 6,967,824 B2 | 11/2005 | Marinero | |
| 7,016,165 B2 | 3/2006 | Chien et al. | |
| 7,050,276 B2 | 5/2006 | Nishiyama | |
| 7,116,527 B1 | 10/2006 | Fukuzawa et al. | |
| 7,259,941 B2 | 8/2007 | Pinarbasi | |
| 7,515,388 B2 * | 4/2009 | Zhang et al. | 360/324.12 |
| 2002/0015268 A1 | 2/2002 | Mao et al. | |
| 2003/0228490 A1 * | 12/2003 | Kim | 428/694 T |
| 2004/0196597 A1 | 10/2004 | Marinero | |
| 2005/0280958 A1 | 12/2005 | Saito et al. | |
| 2006/0087772 A1 | 4/2006 | Pinarbasi | |
| 2006/0176622 A1 | 8/2006 | Pinarbasi | |
| 2006/0218774 A1 | 10/2006 | Carey et al. | |
| 2006/0222112 A1 | 10/2006 | Carey et al. | |

(Continued)

OTHER PUBLICATIONS

Gun Choe et al., "High Coercivity CoPtCr, CoPt Films Deposited at High Power and High Bias Conditions for Hard Bias Applications in Magnetoresistive Heads", Journal of Applied Physics, vol. 81, No. 8, pp. 4894-4896, Apr. 1997.

(Continued)

*Primary Examiner* — Kelly M Gambetta

(57) ABSTRACT

A method for providing a hard bias structure is provided. The method comprises providing a seed layer for a hard bias layer, the seed layer having a seed layer lattice constant and a natural growth texture. The method further comprises depositing the hard bias layer for the hard bias structure on the seed layer, the natural growth texture corresponding to a texture for the hard bias layer. The hard bias layer has a bulk lattice constant. The step of providing the seed layer includes forming a first plasma of a first deposition gas configured to expand the seed layer lattice constant if the bulk lattice constant is greater than the seed layer constant. The step of depositing the hard bias layer includes forming a second plasma of a second deposition gas configured to expand the bulk lattice constant if the seed layer lattice constant is greater than the bulk lattice constant.

13 Claims, 4 Drawing Sheets

(56) References Cited

U.S. PATENT DOCUMENTS

| | | |
|---|---|---|
| 2007/0206336 A1 | 9/2007 | Hasegawa et al. |
| 2007/0253123 A1 | 11/2007 | Freitag et al. |
| 2008/0030908 A1 | 2/2008 | Kagami et al. |
| 2008/0137237 A1 | 6/2008 | Freitag et al. |
| 2008/0278866 A1 | 11/2008 | Ishizone et al. |

OTHER PUBLICATIONS

J. K. Howard et al., "The Effect of Cr and W Nucleation Layers on the Magnetic Properties of CoPt Films", Journal of Applied Physics, vol. 63, No. 8, pp. 3263-3265, Apr. 1988.

A. Tsoukatos et al., "Cr\(CoPtCr, CoPtx) Layered Film Studies for Hard Bias Applications", Journal of Applied Physics, vol. 79, No. 8, pp. 5018-5020, Apr. 1996.

\* cited by examiner

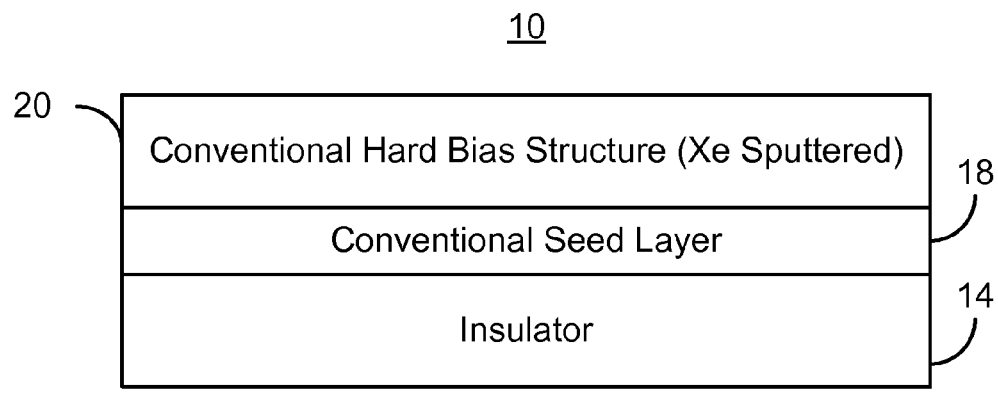

102 — Provide Seed Layer Having Natural Growth Texture and Lattice Constant by Deposition in a First Deposition Gas, the First Deposition Gas Configured to Expand the Lattice of the Seed Layer if the Bulk Lattice Constant of a Hard Bias Layer of the Hard Bias Structure is Greater Than the Seed Layer Lattice Constant

104 — Provide Hard Bias Layer Having Texture and a Bulk Lattice Constant by Deposition in a Second Deposition Gas, the Second Deposition Gas Configured to Expand the Lattice of the Hard Bias Layer if the Seed Layer Lattice Constant is Greater Than the Bulk Lattice Constant

FIG. 2

METHOD FOR PROVIDING AN IMPROVED HARD BIAS STRUCTURE

CROSS REFERENCE TO RELATED APPLICATIONS

This application is a divisional of U.S. patent application Ser. No. 12/140,211, filed on Jun. 16, 2008, which is hereby incorporated by reference in its entirety.

BACKGROUND

FIG. 1 depicts a portion of a conventional hard bias structure 10 that may be used in a conventional read transducer or other device. Such a conventional read transducer would typically include a conventional shield, a conventional insulator, a read sensor, conventional leads, conventional insulator, and a conventional top shield in addition to the hard bias structure. The conventional had bias structure 10 is typically used to bias the read sensor.

The conventional hard bias structure 10 includes a conventional hard bias layer 20 and a conventional seed layer 18 that may reside on a conventional insulator 14. The conventional seed layer 18 is formed prior to the conventional hard bias layer 20. The seed layer 18 is desired to provide a surface suitable for growth of the conventional hard bias layer 20. The conventional seed layer 18 is typically composed of a layer of Cr, CrV, or CrTi. Alternatively, the conventional seed layer 18 may be a bilayer including a Ta underlayer (not separately shown) and a W layer (not separately shown) between the conventional hard bias layer 20 and the Ta underlayer. The conventional seed layer 18 is typically formed by sputtering the Cr, CrV, CrTi, W and/or Ta in a Xe gas plasma.

The conventional magnetic hard bias layer 20 is formed on the conventional seed layer 18 by sputtering the material for the conventional hard bias layer 20 on the conventional seed layer 18. In conventional methods, the material such as CoPt, is sputtered in a Xe gas onto the conventional seed layer 18.

The conventional hard bias structure 10 may be used to magnetically bias the read sensor. For example, the conventional magnetic hard bias structure 10 may ensure that the free layer (not shown in FIG. 1) is stable and single domain. To ensure the stability of the read sensor, the conventional magnetic hard bias structure 10 should not be affected by external magnetic fields, for example from the recording media or write transducer. The conventional hard bias layers 20 are desired to have a high remanence magnetization, a large coercivity, and be thermally stable.

Although the conventional hard bias structure 10 functions, one of ordinary skill in the art will recognize that there are drawbacks. In particular, the magnetization of the conventional hard bias layer 20 may be disturbed during operation of the conventional magnetic read transducer. As a result, the free layer (not shown in FIG. 1) may be destabilized. Consequently, performance of the conventional magnetic transducer may be adversely affected Accordingly, what is needed is a system and method for providing an improved hard bias structure.

BRIEF SUMMARY OF THE INVENTION

A method and system for providing a magnetic transducer is described. The method and system further include providing a seed layer for a hard bias structure. The seed layer has a lattice constant and a natural growth texture. The method and system further include depositing the hard bias layer for the hard bias structure on the seed layer. The natural growth texture corresponds to a texture for the hard bias layer. The hard bias layer has a bulk lattice constant. The step of providing the seed layer includes forming a first plasma of a first deposition gas configured to expand the seed layer lattice constant if the bulk lattice constant is greater than the seed layer constant. The step of depositing the hard bias layer further includes forming a second plasma of a second deposition gas configured to expand the bulk lattice constant if the seed layer lattice constant is greater than the bulk lattice constant.

BRIEF DESCRIPTION OF SEVERAL VIEWS OF THE DRAWINGS

FIG. 1 is a diagram of a conventional hard bias structure.

FIG. 2 is a flow chart of an exemplary embodiment of a method for fabricating a hard bias structure.

DETAILED DESCRIPTION OF THE PREFERRED EMBODIMENTS

Figure 3:
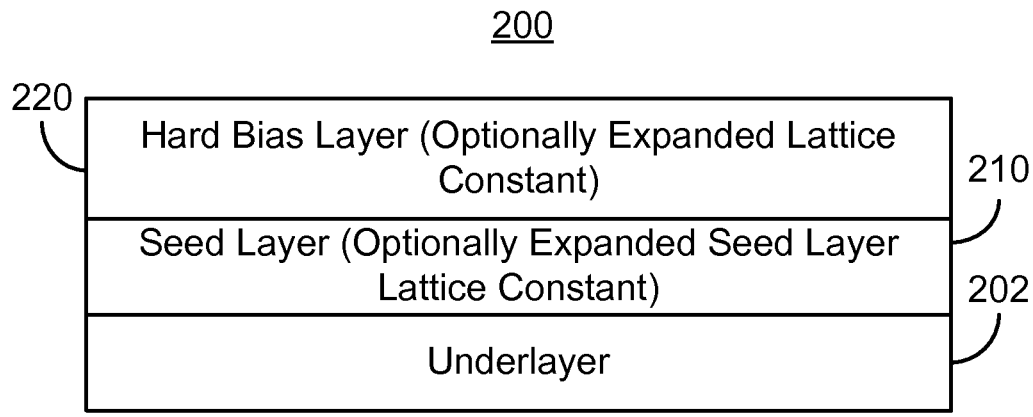
FIG. 3 depicts a hard bias structure that may be formed in a magnetic transducer.

FIG. 2 is a flow chart of an exemplary embodiment of a method 100 for fabricating a hard bias structure. For simplicity, some steps may be omitted. FIG. 3 depicts an exemplary embodiment of a hard bias structure 200. Referring to FIGS. 2-3, the hard bias structure 200 may be used in a magnetic transducer, such as in biasing a read sensor of a read transducer. The read transducer may be part of a merged head that also includes a write transducer (not shown) and resides on a slider (not shown). The method 100 also may commence after formation of other structures of the read and/or write transducer. The method 100 is also described in the context of providing a single hard bias structure 200. However, the method 100 may be used to fabricate multiple structures at substantially the same time. The method 100 and hard bias structure 200 are also described in the context of particular layers. However, in some embodiments, such layers may include sub-layer(s).

A seed layer 210 is provided on an underlayer 202, via step 102. In one embodiment, the underlayer 202 includes aluminum oxide. At least a portion of the seed layer 210 is crystalline in nature. The seed layer 210 thus has a seed layer lattice constant. Providing the seed layer in step 102 includes forming a plasma of a first deposition gas. In one embodiment, step 102 may be implemented by sputtering the seed layer 210 using the first plasma. The first deposition gas is configured to expand (e.g. increase) the seed layer lattice constant if the bulk lattice constant of a hard bias layer, described below, is greater than the seed layer lattice constant. In one such embodiment, the first deposition gas includes a first gas that is lighter than Xe and inert with respect to material(s) used in seed layer 210. In another embodiment, the seed layer lattice may not be so expanded. In such an embodiment, the seed layer 210 may be provided by deposition, for example sputtering, in a Xe gas plasma.

The seed layer 210 formed in step 102 has a natural growth texture. The natural growth texture of the seed layer 210 is the orientation of the crystal structure that is most prevalent in the seed layer 210 as provided on the underlayer 202. For example, the top W layer, or the entire seed layer 210 may be a body-centered cubic (BCC) structure and have a (110) orientation.

Step 102 may also include providing a bilayer as at least a portion of the seed layer. In one embodiment, the bilayer includes bottom layer (not separately shown) that is amorphous and a top layer (not separately shown) that is crystalline. For example, the bottom layer may include at least one of Ta, TaZr, B, FeCoB, and ZrCuB. The top layer may have a BCC structure. Examples of materials that might be used for the top layer include at least one of Ta, CrTi, CrV, Cr, V, WCr, W, NiAl. For example, in one such embodiment, the bottom layer may be Ta, while the top layer might be W. In such an embodiment, the W layer would exhibit a natural growth texture of (110) and be characterized by the seed layer lattice constant. Alternatively, the seed layer may be a single layer or have another number of sublayers. The seed layer may, for example, include a single layer of at least one of Ta, CrTi, CrV, Cr, V, WCr, W, and NiAl. In another embodiment, the entire seed layer 210 may include Ta, CrTi, CrV, Cr, V, WCr, W, and/or NiAl The hard bias layer 220 for the hard bias structure 200 is provided on the seed layer 210, via step 104. The hard bias layer 220 has a high saturation magnetization, a high coercivity, and a crystal structure. In one embodiment, the hard bias layer 220 includes at least one of CoPt, CoCrPt, and CoSm. However, other materials may be used. For example, other hexagonal close-packed (hcp) structure having a lattice constant that is not more than fifteen percent different from the bulk lattice constant of CoPt may be used. In another embodiment, an hcp structure having a lattice constant that is not more than ten percent different from the bulk lattice constant of CoPt may be used.

Providing the hard bias layer 220 in step 104 further includes forming a second plasma of a second deposition gas. In one embodiment, the hard bias layer 220 is sputtered using the second plasma. The hard bias layer 220 is associated with a bulk lattice constant. The bulk lattice constant is an expected lattice constant for the hard bias layer 220 if it was produced in bulk instead of a thin film. The second plasma and second deposition gas are configured to expand the lattice constant for the hard bias layer 220 if the seed layer lattice constant for the seed layer 210 is greater than the bulk lattice constant for the hard bias layer 220. In such an embodiment, the second deposition gas may include gas(es) that are lighter than xenon and inert with respect to the hard bias layer 220.

Step 104 also provides the hard bias layer 220 such that the hard bias layer 220 has a texture and a grain size. The texture of the hard bias layer 220 is the orientation of the crystal structure that is most prevalent in the hard bias layer 220. For example, in one embodiment, the texture of the hard bias layer 220 corresponds to the natural growth texture for the seed layer and may be a desired texture for a high saturation magnetic moment. For such a texture the magnetizations of the grains are desired to be aligned in plane. In addition, a small grain size may be desired. For example, in one embodiment, the hard bias layer 220 may include CoPt with a (10$\bar{1}$0) texture.

Using the method 100, the hard bias layer 220 may have its lattice expanded to better match the lattice of the seed layer 210. This may be accomplished by depositing, for example via sputtering, the seed layer 210 using a Xe gas plasma. In such an embodiment, the hard bias layer is deposited, for example sputtering, using plasma from a noble gas lighter than Xe, such as Ar or Kr. This embodiment might be used for seed layer 210 including W and a CoPt hard bias layer 220. It is believed that because the Ar or Kr is lighter than the Xe, the Ar or Kr is more likely to be incorporated into the lattice of the hard bias layer 220. For example, the hard bias layer 220 may have up to four atomic percent of Ar. In one such embodiment, the hard bias layer 220 may have at least one and not more than two atomic percent of Ar incorporated into its CoPt lattice. As a result, the lattice of the hard bias layer 220 may be expanded Similarly, the seed layer 210 may have its lattice expanded to better match the lattice of the hard bias layer 220. This embodiment might be used, for example, for a CrTi seed layer 210 and a CoPt hard bias layer 220. This may be accomplished by depositing, for example via sputtering, the seed layer 210 using a plasma of a noble gas that is lighter than Xe and depositing the hard bias layer 220 using a Xe gas plasma. It is believed that because the Ar or Kr is lighter than the Xe, the Ar or Kr is more likely to be incorporated into the lattice of the seed layer 210. For example, the seed layer 210 may have up to four atomic percent of Ar in the portion sputtered using Ar. In one such embodiment, the portion of the seed layer 210 may have at least one and not more than two atomic percent of Ar incorporated into its lattice. As a result, the lattice of the seed layer 210 may be expanded.

Thus, the lattice of the hard bias layer 220 and/or the seed layer 210 may be expanded. Because the lattices of the hard bias layer 220 and seed layer 210 may be better matched with the desired textures, the hard bias layer 220 may have its magnetization oriented closer to the plane of the layers 210 and have smaller grains. As a result, the coercivity of the hard bias layer 220 may be increased and stability of the hard bias structure 200 improved.

Figure 4:
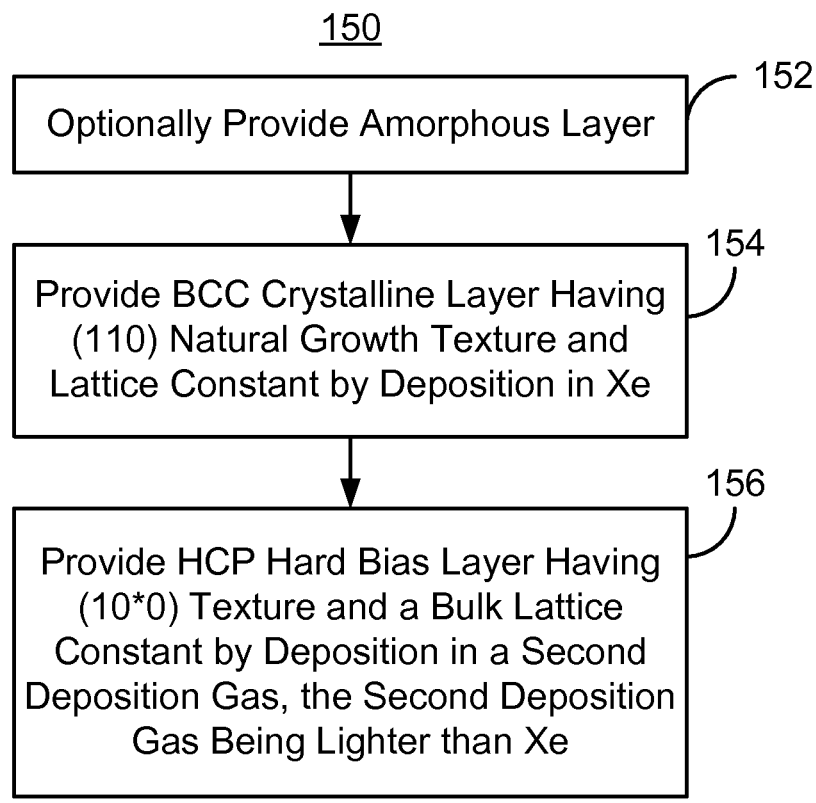
FIG. 4 is a flow chart of another exemplary embodiment of a method for fabricating a hard bias structure.

FIG. 4 is a flow chart of another exemplary embodiment of a method 150 for fabricating a hard bias structure that might be used in a magnetic transducer. For simplicity, some steps may be omitted. If the hard bias structure is incorporated into a magnetic head, the method 150 also may commence after formation of other structures of the read and/or write transducer. The method 150 is also described in the context of providing a single hard bias structure. However, the method 150 may be used to fabricate multiple structures at substantially the same time. The method 150 is also described in the context of particular layers. However, in some embodiments, such layers may include sub-layer(s).

An amorphous layer may be provided on the underlayer, via step 152. In one embodiment, the underlayer includes aluminum oxide. For example, the amorphous layer may include at least one of Ta, TaZr, B, FeCoB, and ZrCuB. In one embodiment, the amorphous layer is sputtered on the underlayer. However, in another embodiment, step 152 might be omitted.

A crystalline layer is provided on the amorphous layer (or underlayer if the amorphous layer is omitted), via step 154. The amorphous layer, if present, and the crystalline layer together form a seed layer. The crystalline layer has a seed layer lattice constant. Providing the crystalline layer includes forming a plasma of a first deposition gas. In one embodiment of the method 150, the first deposition gas is Xe. For the method 150, the seed layer lattice constant of the crystalline layer is greater than the bulk lattice constant of a hard bias layer, described below.

The hard bias layer for the hard bias structure is provided on the crystalline layer of the seed layer, via step 156. The hard bias layer may have an hcp structure, a high saturation magnetization, and a high coercivity. Step 156 includes forming a second plasma of a second deposition gas and sputtering the material for the hard bias layer using the second plasma.

The second plasma and second deposition gas are configured to expand the bulk lattice constant of the hard bias layer. Thus, the second deposition gas includes gas(es) that are inert with respect to the hard bias layer and lighter than the first deposition gas used to deposit the crystalline layer. In the embodiment shown, the second deposition gas is lighter than Xe. For example, Ar and/or Kr might be used as the second deposition gas.

In one embodiment, hard bias layer includes at least one of CoPt, CoCrPt, and CoSm. However, other materials may be used. For example, other hcp materials having a lattice constant that is not more than fifteen percent different from the bulk lattice constant of CoPt may be used. In another embodiment, an hcp material having a lattice constant that is not more than ten percent different from the bulk lattice constant of CoPt may be used.

It is believed that because the Ar or Kr is lighter than the Xe, the Ar or Kr is more likely to be incorporated into the lattice of the hard bias layer. For example, the hard bias layer may have up to four atomic percent of Ar. In one such embodiment, the hard bias layer may have at least one and not more than two atomic percent of Ar incorporated into its CoPt lattice. As a result, the lattice of the hard bias layer may be expanded Thus, using the method 150, the hard bias layer may have its lattice expanded to better match the lattice of the crystalline layer. Because of the improved lattice matching, the magnetic properties of the hard bias layer may be improved. As a result, the coercivity of the hard bias layer may be increased and stability of the hard bias structure improved.

Figure 5:
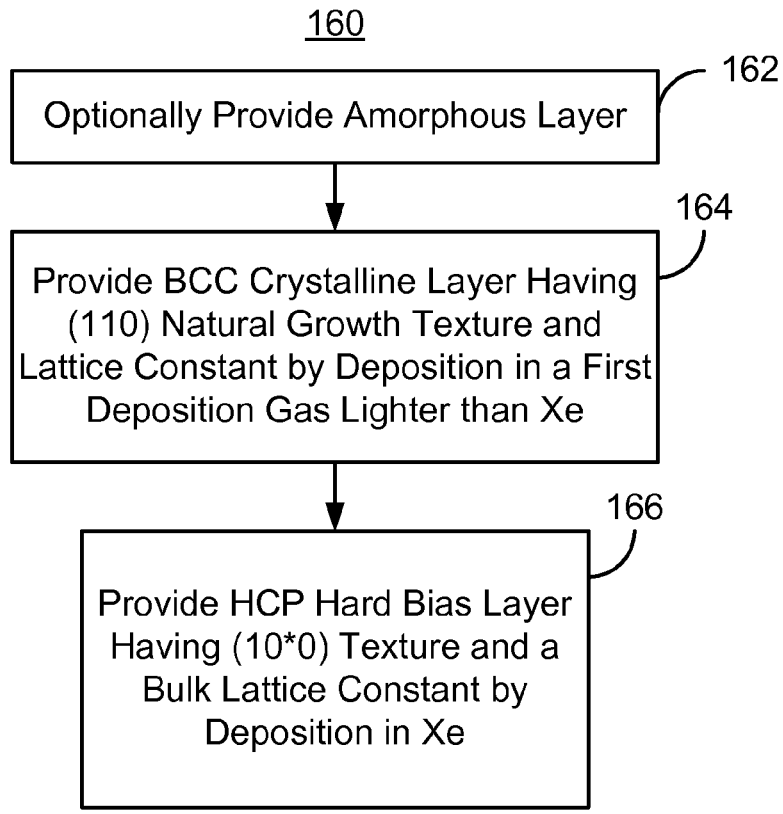
FIG. 5 is a flow chart of another exemplary embodiment of a method for fabricating a hard bias structure.

FIG. 5 is a flow chart of another exemplary embodiment of a method 160 for fabricating a hard bias structure that may be used in a device such as a magnetic transducer. For simplicity, some steps may be omitted. If the hard bias structure is incorporated into a magnetic head, the method 160 also may commence after formation of other structures of the read and/or write transducer. The method 160 is also described in the context of providing a single hard bias structure. However, the method 160 may be used to fabricate multiple structures at substantially the same time. The method 160 is also described in the context of particular layers. However, in some embodiments, such layers may include sub-layer(s).

An amorphous layer may be provided on the underlayer, via step 162. In one embodiment, the underlayer includes aluminum oxide. For example, the amorphous layer may include at least one of Ta, TaZr, B, FeCoB, and ZrCuB. In one embodiment, the amorphous layer is sputtered on the underlayer.

A crystalline layer is provided on the amorphous layer (or underlayer), via step 164. The amorphous layer, if present, and the crystalline layer together form a seed layer. The crystalline layer has a seed layer lattice constant. Providing the crystalline layer includes forming a plasma of a first deposition gas. The first deposition gas is configured to expand (e.g. increase) the seed layer lattice constant of the crystalline layer. Thus, for the method 160, the bulk lattice constant of a hard bias layer, described below, is greater than the seed layer lattice constant. In one embodiment, the first deposition gas includes gas(es) that are inert with respect to material(s) used in crystalline layer and lighter than the second deposition gas used to provide the hard bias layer, as described below. For example, in one embodiment, the gas used to form the plasma may be Ar or Kr. In such an embodiment, Xe may be used to provide the hard bias layer in step 166.

It is believed that because the Ar or Kr is lighter than the Xe, the Ar or Kr is more likely to be incorporated into the lattice of the crystalline layer. For example, the crystalline layer may have up to four atomic percent of Ar in the portion sputtered using Ar. In one such embodiment, the portion of the crystalline layer may have at least one and not more than two atomic percent of Ar incorporated into its lattice. As a result, the lattice of the seed layer may be expanded. Further, the crystalline layer provided in step 164 has a natural growth texture. In one embodiment, the crystalline layer has a BCC structure and a (110) natural growth texture. In one embodiment, the crystalline layer includes at least one of Ta, CrTi, CrV, Cr, V, WCr, W, NiAl.

The hard bias layer for the hard bias structure is provided on the seed layer, via step 166. The hard bias layer may have an hcp structure, a high saturation magnetization, and a high coercivity. Step 166 includes forming a second plasma of a second deposition gas and sputtering the material for the hard bias layer using the second plasma. In one embodiment, the second deposition gas used may be Xe In one embodiment, hard bias layer includes at least one of CoPt, CoCrPt, and CoSm. However, other materials may be used. For example, other hcp materials having a lattice constant that is not more than fifteen percent different from the bulk lattice constant of CoPt may be used. In another embodiment, an hcp material having a lattice constant that is not more than ten percent different from the bulk lattice constant of CoPt may be used.

Thus, using the method 160, the crystalline layer may have its lattice expanded to better match the lattice of the hard bias layer. Because of the improved lattice matching, the magnetic properties of the hard bias layer may be improved. As a result, the coercivity of the hard bias layer may be increased and stability of the hard bias structure 200' improved.

Figure 6:
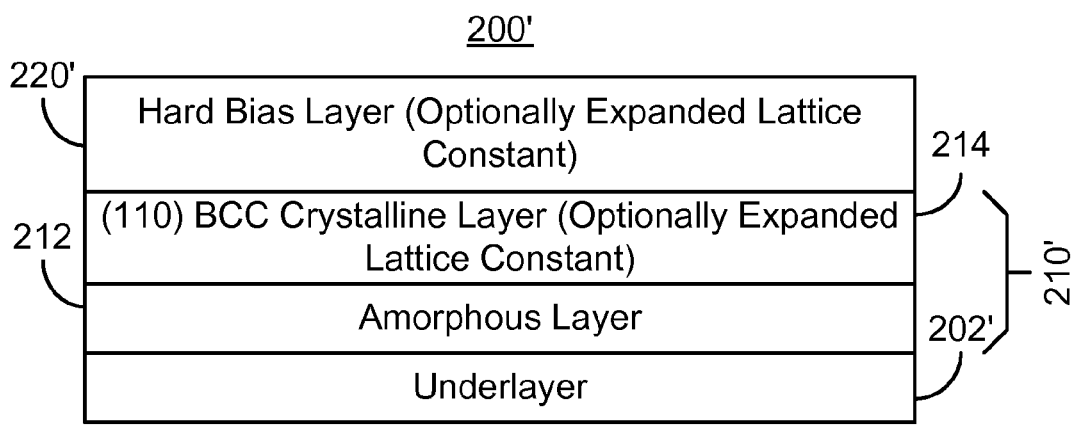
FIG. 6 depicts an exemplary embodiment of a hard bias structure.

FIG. 6 depicts one embodiment of a hard bias structure 200' formed using the method 150 or 160 of FIG. 4 or 5, respectively. Referring to FIGS. 4-6, the hard bias structure 200' may be used in a magnetic transducer, such as in biasing a read sensor of a read transducer. The read transducer may be part of a merged head that also includes a write transducer (not shown) and resides on a slider (not shown). The hard bias structure 200' is also described in the context of particular layers. However, in some embodiments, such layers may include sub-layer(s).

The hard bias structure 200' is formed on an underlayer 202' that may include aluminum oxide and includes seed layer 210' and hard bias layer 220'. The seed layer includes an amorphous layer 212 and a crystalline layer 214. The amorphous layer 212 is formed using step 152 or 162. The amorphous layer 212 may include at least one of Ta, TaZr, B, FeCoB, and ZrCuB. The crystalline layer 214 is formed using step 152 or 162. The crystalline layer 214 may include at least one of Ta, CrTi, CrV, Cr, V, WCr, W, NiAl. In the embodiment shown, the crystalline layer 214 has a natural growth texture of (110) and a BCC crystal structure. If formed using step 164, then the seed layer lattice of the crystalline layer 214 is expanded to reduce the mismatch with the (larger) lattice constant of the hard bias layer 220'. In such an embodiment, the crystalline layer 214 may have gas(es) such as Ar and/or Kr incorporated into the lattice. If the crystalline layer 214 is formed in step 164, then less Xe is expected to be incorporated into the lattice because Xe is heavier than Ar and Kr.

The hard bias layer 220' has a high coercivity and high saturation magnetization. In one embodiment, the hard bias layer 220' is hcp in structure and has a (10$\bar{1}$0) texture. For example, the hard bias layer 220' may include at least one of CoPt, CoCrPt, and CoSm. If the hard bias layer 220' is formed using step 156, then the bulk lattice constant of the hard bias layer has been expanded to reduce the mismatch with the (larger) lattice constant of the crystalline layer 214. In such an embodiment, incorporation of the Ar and/or Kr used is expected. If the hard bias layer 220' is formed using step 166, then less Xe is expected to be incorporated into the lattice.

The hard bias structure 200' may have improved magnetic properties. In particular, the hard bias layer 220' may have its lattice expanded to better match the lattice of the crystalline layer 214, or vice versa. Because of the improved lattice matching, the magnetic properties of the hard bias layer 220' may be improved. In addition, the in-plane texture may also be improved. As a result, the coercivity of the hard bias layer may be increased and stability of the hard bias structure 200' improved.

Figure 7:
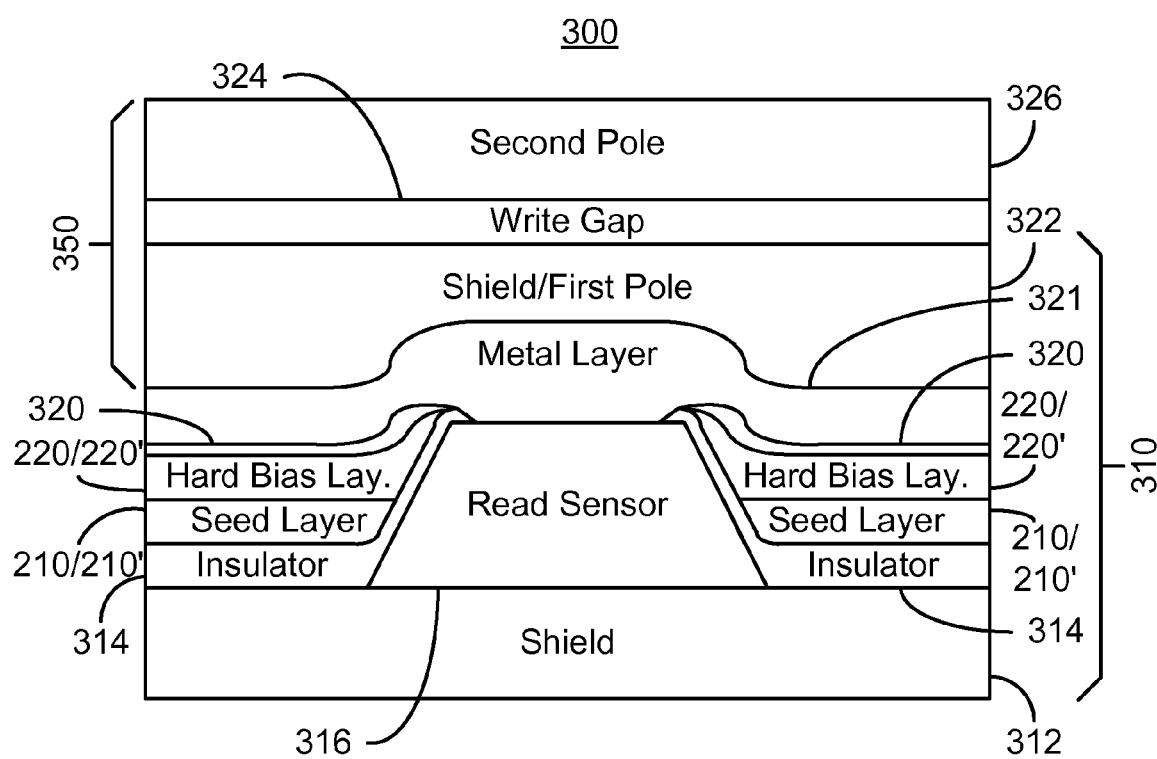
FIG. 7 depicts an exemplary embodiment of a magnetic head.

FIG. 7 depicts an exemplary embodiment of a magnetic head 300. The magnetic head 300 may use the hard bias structure(s) 200 and/or 200'. In the embodiment shown, the magnetic head 300 includes a read transducer 310 and a write transducer 350. The read transducer 310 includes a shield 312, an insulator 314, read sensor 316, seed layers 210/210', hard bias layers 220/220', hard bias capping layer 320, metal capping layer 321 and shield 322.

In some embodiments, the read sensor 316 is a magnetoresistive or giant magnetoresistive sensor, such as a spin valve or a tunneling magnetoresistive junction. In such a case, the read sensor 316 would typically include at least an antiferromagnetic pinning layer, a magnetic pinned layer adjacent to the antiferromagnetic pinning layer, a nonmagnetic spacer layer, and a free layer. For simplicity, these layers are not separately shown in FIG. 7. The magnetization of the free layer changes direction based upon the magnetic field from a recording medium (not shown). The change in the relative orientations of the magnetization of the free and pinned layers alters the resistance of the read sensor 316. Thus, the read sensor 316 allows the read transducer 300 to read data.

The write transducer 350 includes shield/first pole 322, write gap 324 and second pole 326. In another embodiment, other structures may be part of the write transducer 350. In addition, although shown as a single structure, the shield and first pole of the shield/first pole 322 may be separated.

The hard bias structure 200/200' is used in the read transducer 310 to provide structures 220/220' and 210/210'. Thus, the methods 100, 150 and/or 160 might be used in fabricating the head 300. As a result, the hard bias layer 220/220' may have improved characteristics. Thus, stability and performance of the read transducer 310 may be improved.

We claim:

1. A method for providing a hard bias structure comprising:
   providing a seed layer for a hard bias layer, the seed layer having a seed layer lattice constant and a natural growth texture;
   depositing the hard bias layer for the hard bias structure on the seed layer, the natural growth texture corresponding to a texture for the hard bias layer, the hard bias layer having a bulk lattice constant;
   wherein the step of providing the seed layer includes forming a first plasma of a first deposition gas configured to expand the seed layer lattice constant if the bulk lattice constant is greater than the seed layer constant; and
   wherein the step of depositing the hard bias layer further includes forming a second plasma of a second deposition gas configured to expand the bulk lattice constant if the seed layer lattice constant is greater than the bulk lattice constant;
   wherein the first deposition gas is lighter than the second deposition gas if the bulk lattice constant is greater than the seed layer lattice constant and wherein the second deposition gas is lighter than the first deposition gas if the seed layer lattice constant is greater than the bulk lattice constant.

2. The method of claim 1 wherein the seed layer includes a bilayer including an amorphous layer and a body-centered cubic layer on the amorphous layer.

3. The method of claim 2 wherein the amorphous layer includes at least one of Ta, TaZr, B, FeCoB, and ZrCuB.

4. The method of claim 1 wherein the seed layer includes a body-centered cubic material.

5. The method of claim 4 wherein the seed layer consists of the body-centered cubic material and the natural growth texture is (110).

6. The method of claim 1 wherein the seed layer includes at least one of CrTi, CrV, Cr, W, WCr, V, and NiAl.

7. The method of claim 1 wherein:
   wherein if the bulk lattice constant is greater than the seed layer constant, the first deposition gas includes a first gas that is lighter than xenon and inert with respect to the seed layer; and
   if the seed layer lattice constant is greater than the bulk lattice constant, the second deposition gas includes a second gas that is lighter than xenon and inert with respect to the hard bias layer.

8. The method of claim 7 wherein the first gas is a noble gas.

9. The method of claim 7 wherein the second gas is a noble gas.

10. The method of claim 1 wherein the hard bias layer includes at least one of CoPt, CoCrPt, and CoSm.

11. A method for providing a hard bias structure comprising:
    providing a seed layer for a hard bias layer, the seed layer having a seed layer lattice constant and a natural growth texture;
    depositing the hard bias layer for the hard bias structure on the seed layer, the natural growth texture corresponding to a texture for the hard bias layer, the hard bias layer having a bulk lattice constant; and
    wherein the step of providing the seed layer includes forming a first plasma of a first deposition gas configured to expand the seed layer lattice constant if the bulk lattice constant is greater than the seed layer constant;
    wherein the step of depositing the hard bias layer further includes forming a second plasma of a second deposition gas configured to expand the bulk lattice constant if the seed layer lattice constant is greater than the bulk lattice constant;
    wherein the hard bias layer includes a material having a hexagonal close-packed crystal structure having a lattice constant that is not more than fifteen percent different from a CoPt lattice constant.

12. The method of claim 11 wherein the lattice constant is not more than ten percent different from the CoPt lattice constant.

13. A method for providing a hard bias structure comprising:
    providing a seed layer for a hard bias layer, the step of providing the seed layer including
    providing an amorphous Ta layer; and
    providing a W layer on the Ta layer, the W layer having a seed layer lattice constant and a (110) natural growth texture; and
    depositing the hard bias layer for the hard bias structure on the W layer in an Ar plasma, the hard bias layer including CoPt, the (110) natural growth texture corresponding to a (10$\bar{1}$0) texture for the hard bias layer, the hard bias layer having a bulk lattice constant;
wherein the step of providing the seed layer includes forming a first plasma of a first deposition gas configured to expand the seed layer lattice constant if the bulk lattice constant is greater than the seed layer lattice constant, the first deposition gas being lighter than Ar if the bulk lattice constant is greater than the seed layer lattice constant; and
wherein the Ar is lighter than the first deposition gas and is configured to expand the bulk lattice constant if the seed layer lattice constant is greater than the bulk lattice constant.

* * * * *